United States Patent [19]

Lichtmann et al.

[11] Patent Number: 4,828,938

[45] Date of Patent: May 9, 1989

[54] METHOD FOR DEPOSITING MATERIALS CONTAINING TELLURIUM AND PRODUCT

[75] Inventors: Lawrence S. Lichtmann, Redondo Beach; James D. Parsons, Newbury Park, both of Calif.

[73] Assignee: Hughes Aircraft Company, Los Angeles, Calif.

[21] Appl. No.: 851,004

[22] Filed: Apr. 11, 1986

[51] Int. Cl.$^4$ .................. B32B 9/00; C23C 16/30
[52] U.S. Cl. .................. 428/689; 427/255; 427/255.2; 428/697; 428/938; 437/225
[58] Field of Search .............. 427/255.2, 255, 87, 427/314; 428/689, 697, 938; 437/225

[56] References Cited

U.S. PATENT DOCUMENTS

| | | | |
|---|---|---|---|
| 2,932,592 | 4/1960 | Cameron | 427/87 |
| 3,224,912 | 12/1965 | Ruehrwein | 427/87 |
| 3,825,439 | 7/1974 | Tick | 427/87 |
| 3,966,512 | 6/1976 | Nonaka | 427/87 |
| 4,058,430 | 11/1977 | Suntola et al. | 427/87 |
| 4,352,834 | 10/1982 | Taketoshi et al. | 427/87 |
| 4,445,965 | 5/1984 | Milnes | 427/87 |
| 4,509,997 | 4/1985 | Cockayne et al. | 427/87 |
| 4,566,918 | 1/1986 | Irvine et al. | 427/87 |
| 4,568,397 | 2/1986 | Hoke et al. | 148/175 |
| 4,650,539 | 3/1987 | Irvine et al. | 427/255.2 |

FOREIGN PATENT DOCUMENTS

| | | | |
|---|---|---|---|
| 135344 | 3/1985 | European Pat. Off. | 148/175 |
| 1001234 | 2/1983 | U.S.S.R. | 427/87 |

OTHER PUBLICATIONS

Kuech et al, "Low Temperature CVD Growth of Epitaxial HgTe on CdTe", J. of the Electrochemical Society, vol. 128, No. 5, pp. 1142-1144, May 1981.

Hoke et al, "Metalorganic Growth of CdTe and HgCdTe Epitaxial Films at a Reduced Substrate Temperature Using Diisopropyltelluride", Applied Physics Letters, vol. 46, No. 4, pp. 398-400, Feb. 1985.

Primary Examiner—Sadie L. Childs
Attorney, Agent, or Firm—Wanda K. Denson-Low; V. G. Laslo; A. W. Karambelas

[57] ABSTRACT

A method for chemical vapor deposition of materials containing tellurium, such as cadmium telluride and mercury cadmium telluride, wherein the reactant source of the tellurium is a tellurophene or methyltellurol. These reactant sources have high vapor pressures, and the reactant source vapors emitted from the reactant sources have decomposition temperatures of less than about 300° C., so that deposition may be accomplished at low temperatures of about 250° C. The reactant source vapor containing tellurium is mixed with a reactant source vapor containing another substance to be codeposited, such as dimethylcadmium or dimethylmercury, and contacted with a substrate maintained at the deposition temperature, the deposition being preferably accomplished in an inverted vertical chemical vapor deposition reactor.

20 Claims, 2 Drawing Sheets

METHOD FOR DEPOSITING MATERIALS CONTAINING TELLURIUM AND PRODUCT

BACKGROUND OF THE INVENTION

This invention relates generally to chemical vapor deposition of semiconducting thin films, and, more specifically, to deposition of films of materials containing tellurium.

Thin, single-crystal films of doped semiconductor materials play important roles in many devices such as electronic components, lasers and detectors for detecting particular types of radiation. The development of these devices depends upon the ability to fabricate thin-film crystals having the required chemical composition, level of dopants, degree of crystalline perfection, surface quality, and thickness uniformity over large areas. The thin films are typically on the order of 10 microns or less in thickness, and are fabricated by deposition on a substrate.

Materials formed from elements in groups II, III, and IV of the periodic table (and their related subgroups such as IIa and IIb), together with elements in the group VI, have been found to have important semiconducting properties that can be applied in a variety of devices. Among such (II, III, IV–VI) materials are those wherein the group VI component is entirely or partly tellurium, these materials being termed (II, III, IV-tellurium) materials. Such materials can be compounds with narrowly defined composition limits or solid solutions with variable composition ranges.

One class of (II, III, IV-tellurium) materials of particular interest is based upon cadmium telluride. Doped cadmium telluride thin films have found particular application in electronic devices. Doped mercury cadmium telluride thin films are nearly ideal for detecting radiation in the near and far infrared ranges. Focal plane arrays for far infrared detectors can be fabricated in such films. The promise of mercury cadmium telluride in this and other applications such as far-infrared detecting diodes and superlattices has been demonstrated, but the ability to fabricate the required thin film crystals with sufficiently large lateral dimensions and uniform thicknesses has yet to be established.

One approach to the fabrication of (II, III, IV-tellurium) materials such as cadmium telluride and mercury cadmium telluride is chemical vapor deposition, wherein reactant source vapors containing the various constituents of the material are reacted at the surface of the selected substrate. Chemical vapor deposition offers the potential for close control of the material properties of the film such as chemistry, dopant levels and crystalline perfection, and of the physical properties of the film such as surface quality and thickness uniformity. With the proper selection of the reactant source vapors and reaction conditions, such a reaction results in deposition of a thin film of the material of interest onto the surface of the substrate, with the undeposited portions of the reactant source vapors being carried away from the substrate and out of the system in a flowing gas stream. The energy to effect the reaction can be supplied by heat or other means such as light. The success of this chemical vapor deposition technique for any particular material depends directly upon selection of the proper reactant sources for the substances to be codeposited.

Focusing on one particular example, in order to deposit cadmium telluride, there must be reactant sources of cadmium and tellurium, while to deposit mercury cadmium telluride, there must further be a reactant source of mercury. Reactant sources for all three of these components are known, and successful chemical vapor deposition of both cadmium telluride and mercury cadmium telluride has been accomplished, at substrate temperatures of about 350 C. and higher.

Chemical vapor deposition of laterally large thin films of (II, III, IV-tellurium) materials such as those based upon cadmium telluride at a substrate temperature of less than 300° C., and preferably about 250° C., would be highly desirable, but has heretofore not been possible by unassisted pyrolysis. When conventional deposition temperatures of 350° C. and higher are used, there can be significant diffusion of atoms within the structure and between adjacent regions of different composition and dopant levels, thereby altering the crystal perfection and reducing intentional internal composition gradients that are engineered into the thin films to produce specific electronic properties, as in the preparation of heterojunctions.

The ability to deposit such thin films at low temperatures is currently limited by the unavailability of reactant sources of tellurium having vapors that decompose at low temperatures. Currently preferred tellurium sources are the organometallic compounds dimethyltelluride and diethyltelluride, neither of which achieves complete thermal decomposition below 450° C. Additionally, these compounds can contain oxygen impurities which can cause polymerization of tellurium if photocatalysis is used to provide non-thermal energy to reduce the deposition temperature. Even if only a partial decomposition is accepted, the lowest deposition temperatures that can be achieved with known reactant sources of tellurium in unassisted pyrolysis is about 350° C.

There have been proposed several approaches to achieving reducing decomposition temperatures for thin films of materials such as cadmium telluride. Light energy can be supplied to assist in decomposition in a process termed photocatalysis, but deposition rates and uniformity of the film being deposited are difficult to control. The films can be grown at low temperatures where decomposition is incomplete, but there may result excess carbon contamination and incorporation of second phases of unreacted metal alkyls in the film. Extremely precise control of the substrate temperature is also required, since the film growth rate is temperature dependent. Slight variations in substrate temperature across a large substrate can result in film thickness variations, which can render the resulting film unusable, as, for example, in a focal plane array detector.

Decomposition of the tellurium reactant source vapor can also be promoted by heating the walls of the chemical vapor deposition reactor, but this can lead to heterogeneous nucleation in the gaseous phase and premature condensation. Yet another approach is to use elemental tellurium as the source of tellurium, but the walls of the gas supply system and the reactor must be heated, leading to the same problems as just discussed.

Thus, while it is possible to prepare thin films of (II, III, IV-tellurium) materials such as cadmium telluride and related materials by chemical vapor deposition techniques, the known approaches all involve deposition at excessively elevated temperatures or the use of modifications that introduce unacceptable side effects. There exists a need for a method of preparing such thin film materials, having controllable chemistry and dopant levels, and a high degree of crystalline perfection, and in a physical form having an acceptably smooth surface and uniform thickness, all of these features being attainable in films of large lateral dimensions for use in devices such as detectors. The method should also be reproducible and economical, with an acceptably high growth rate of the film. The present invention fulfills this need, and further provides related advantages.

SUMMARY OF THE INVENTION

The present invention resides in a method of depositing thin films of (II, III, IV-tellurium) materials by chemical vapor deposition. The method allows deposition at substrate temperatures of less than 300° C. Deposition of laterally large, uniform thin films of doped and undoped (II, III, IV-tellurium) materials such as cadmium telluride and mercury cadmium telluride has been accomplished using the approach of the invention at a substrate temperature of 250° C. The growth rate in this range of temperatures is independent of temperature and intensity of the ambient light, leading to excellent uniformity of film thickness over large areas. Films having a thickness on the order of about 1 micrometer and a lateral size of about 4 square centimeters, and without measurable thickness variation, have been fabricated. The maximum growth rate at 250 C is about 5 mi crons per hour, twice that achieved by other low-temperature techniques. The electrical characteristics of the films are comparable with the best results obtained by other techniques.

In accordance with the invention, a method of depositing on a substrate a thin film of a material containing tellurium comprises the steps of providing a reactant source vapor containing tellurium selected from the group consisting of a tellurophene and methyltellurol; mixing the reactant source vapor containing tellurium with a reactant source vapor containing another substance to be codeposited with the tellurium; and contacting the mixture to a substrate maintained at a temperature whereat the reactant source vapors in the mixture decompose and codeposit a material containing tellurium upon the substrate. The method is applicable to (II, III, IV-tellurium) compounds. In the most important embodiment, the substance codeposited is cadmium, mercury, or combinations of cadmium and mercury, the resulting thin film being cadmium telluride or mercury cadmium telluride. A preferred reactant source vapor containing cadmium is dimethylcadmium, and a preferred reactant source vapor containing mercury is dimethylmercury or diethylmercury. Preferred substrate materials are cadmium telluride and indium antimonide, but there is no limitation to these particular substrates. The temperature of the substrate is preferably from about 200° C. to about 300° C., most preferably about 250° C.

In another embodiment that is particularly useful in preparing the films of large lateral extent, a method of depositing on a substrate a thin film of a material containing tellurium comprises the steps of providing a reactant source vapor containing tellurium selected from the group consisting of a tellurophene and methyltellurol; mixing the reactant source vapor containing tellurium with a reactant source vapor containing another substance to be codeposited with the tellurium, the other substance being selected from the group consisting of cadmium, mercury, and combinations of cadmium and mercury; and introducing the mixture into an inverted vertical chemical vapor deposition reactor, wherein a substrate is maintained at a temperature sufficient that the reactant source vapors in the mixture decompose and codeposit onto the substrate a thin film of a material containing tellurium and the other substrate being codeposited. Thin films produced by this technique using a growth temperature of 250° C. can be made with high surface quality and thickness variations that are so small that they cannot be measured using apparatus sensitive to variations of 3 percent in thickness.

More generally, a method for depositing on a substrate a thin film of a material containing tellurium comprises the steps of providing an organometallic reactant source of tellurium, the source being substance that produces a molecular reactant source vapor containing tellurium and has a vapor pressure of at least 0.5 millimeters of mercury at ambient temperature, the reactant source vapor having a decomposition, temperature, whereat elemental tellurium is released, at less than about 300° C. and having a molecular half life of less than about 1 second at a temperature of from about 200° C. to about 300° C.; mixing the reactant source vapor containing tellurium with a reactant soutrce vapor containing another substance to be codeposited with the tellurium, the other substance being selected from the group consisting of elements from group II, group III, and group IV of the periodic table, and mixtures thereof; and contacting the mixture to a substrate maintained at a temperature of less than about 300° C., whereupon the reactant source vapors in the mixture react to codeposit a material containing tellurium upon the substrate. A variety of (II, III, IV-tellurium) materials, including cadmium telluride and mercury cadmium telluride, can be prepared using this approach. This method is preferably practiced using an inverted vertical chemical vapor deposition reactor to achieve uniform growth over large lateral areas. The reactant source of tellurium is preferably a tellurophene or methyltellurol.

As will now be appreciated, the method of the present invention can be used to deposit large thin films of materials containing tellurium, having uniform thickness and excellent surface smoothness. High quality doped and undoped cadmium telluride and mercury cadmium telluride thin films can be grown in commercial sizes and at economical growth rates, at growth temperatures wherein growth is independent of temperature and light intensity, and wherein atomic diffusion in the film is sufficiently low that layered structure having abrupt gradients and transitions are feasible. Other features and advantages of the present invention will become apparent from the following more detailed description, taken in conjunction with the accompanying drawings, which sets forth, by way of example, the principles of the invention.

DETAILED DESCRIPTION OF THE PREFERRED EMBODIMENT

Chemical vapor deposition (CVD) is a process wherein a thin film of a material composed of selected substances or constituents can be codeposited onto a substrate in a precisely controlled manner. The substances to be codeposited are provided in reactant source vapors, which are typically prepared from solid or liquids termed reactant sources (although in some cases reactant source vapors can be furnished directly in gaseous form). A reactant source vapor is produced by contacting a carrier gas to the reactant source, whereby molecules of the reactant source vapor become mixed into the carrier gas due to their escape from the reactant source because of its vapor pressure. The carrier gas carries the reactant source vapors into a reaction tube to contact a substrate upon which the film is deposited.

Energy is supplied at the point where the reactant source vapors contact the substrate, the energy being thermal energy, light energy, or other appropriate type. The energy causes bonds within the molecules of the reactant source vapor to break, freeing the constituents that are to be codeposited. With the selection of the proper reactant source vapors, the desired material is codeposited as a film on the surface of the substrate, and the remaining components of the reactant source vapors are swept away in the flowing gas stram and thence out of the reaction tube. The deposition continues until a desired thickness of the material is built up on the substrate.

Figure 1:
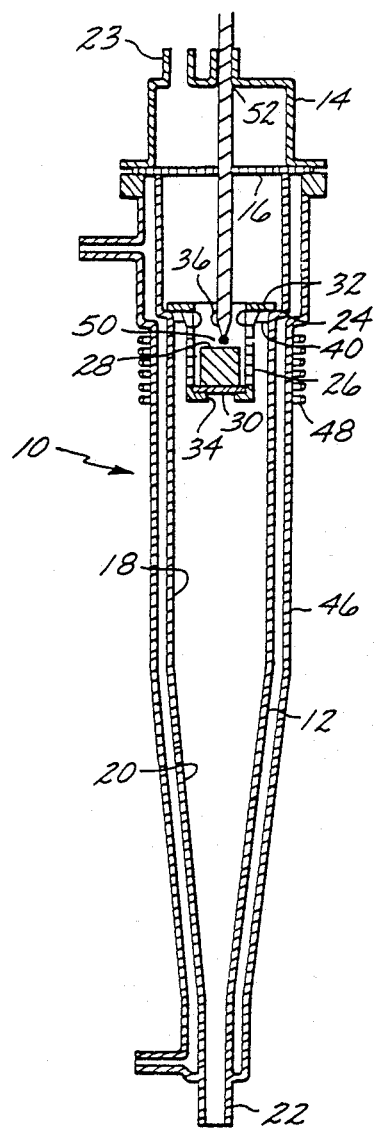
FIG. 1 is a side elevational view of an inverted vertical chemical vapor deposition reactor for growth of thin films.

In practicing the preferred embodiment of the invention, a reactant source vapor containing tellurium and reactant source vapors containing sources of other substances to be codeposited are contacted simultaneously to the surface of a substrate in an inverted vertical chemical vapor deposition reactor 10 of the type depicted in FIG. 1. The reactor 10 comprises a glass reactor tube 12 and a glass reactor tube cap 14. A gasket 16 is provided between the reactor tube 12 and the cap 16 to permit an air tight seal between the tube and the cap.

A substantial length of the reactor tube 12 encloses a substantially cylindrical volume, preferably having a circular cross section that is defined by the inner reactor tube surface 18. The length of this portion of the reactor tube 12 is at least twice its diameter and preferably between three and five times its diameter. The reactor tube 12 is oriented vertically such that the reactor cap 14 is positioned above the remainder of the reactor 10. The lowest portion of the reactor tube 12 is a generally cylindrical funnel shaped inner reactor tube surface 20 terminating at the lowest end in a gas inlet 22. The mixture of reactor vapors is introduced into the reactor tube 12 through the gas inlet 22, and the residual gases remaining after the deposition reaction are removed through a gas outlet 23 at the upper end of the reactor tube 12. The taper of this funnel shaped portion of the reactor 10 should be less than approximately 50 degrees as measured from the vertical mid-line of the reactor tube 12.

A supporting lip 24, inwardly protruding from the cylindrical inner reactor tube surface 18, provides support for a pedestal 26, susceptor 28, and substrate 30. The pedestal 26 is a generally cup-shaped cylinder having a wall portion terminating at the top most portion of the pedestal 26 as an outwardly extending flange 32. The wall portion extends inwardly at right angles at the bottom most portion of the pedestal 26 to form a pedestal base portion having an opening 34 therein. A plurality of holes 36 are symmetrically located in the wall portion of the pedestal 26, preferably such that the top most portion of the holes 36 is level with the lower surface of the flange 32. The pedestal 26 is mounted within the reactor tube 12 by placing the outwardly extending flange 32 over the upper surface of the lip 24 to be supported thereby. An optional spacer 40 may be provided between the supporting lip 24 and the flange 32. In this manner, the cylindrical axis of the pedestal 26 is maintained coextensive with the midline of the reactor tube 12. The lower end portion of the pedestal 26 is maintained in a plane substantially perpendicular to the vertical midline of the reactor tube 12. The opening 34 in the pedestal 26 is also symmetrically centered about the midline of the reactor tube 12.

The inner base portion surface of the pedestal 26 is recessed uniformly, concentric with the opening 34, to eceive the substrate 30. The substrate 30 is thereby mounted facing vertically downwardly, and is aligned perpendicular to, and symmetric about, the midline of the reactor tube 12. The susceptor 28, preferably a solid cylindrical block of graphite optionally coated with a sealing layer of silicon carbide, rests atop the substrate 30.

External to the reactor tube 12, a water cooling jacket 46 permits the direct temperature control of the inner reactor tube surfaces 18 and 20. A conventional radio frequency (RF) coil 48 is positioned opposite and encircling the susceptor 28 to heat the susceptor 28 and, in turn, the substrate 30, by induction heating. Alternatively, a radiation heater can be employed to heat the substrate 30. Such a radiation heater is preferably positioned in the cavity of the pedestal 26 in close proximity to the substrate 30. A thermocouple 50 is inserted through an air-tight electrical lead opening 52 in the reactor tube cap 14 and into the cavity of the pedestal 26 to measure temperature as chemical vapor deposition proceeds.

A mixture of the reactant source vapors is introduced into the reactor tube 12 through the gas inlet 22 and contacted to the heated substrate 30, whereupon a thin film layer containing decomposition products of the reaction of the reactant source vapors is deposited. The residual reaction products not deposited onto the substrate 30 are removed from the vicinity of the substrate 30 and eventually from the reactor tube 12 through the gas outlet 23, by the forced flow of additional gas introduced into the reactor tube 12 through the gas inlet 22.

Figure 2:
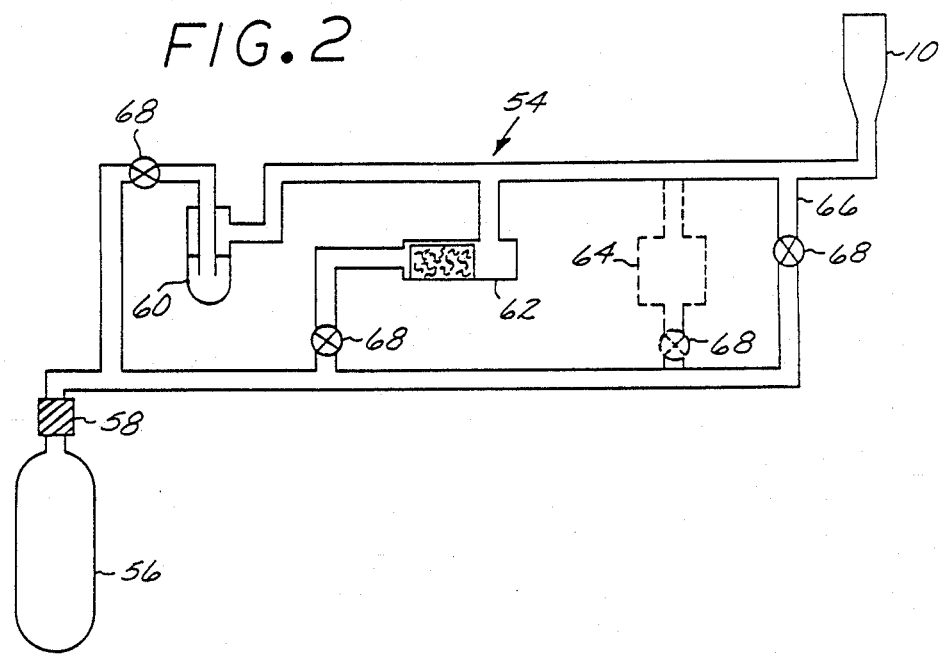
FIG. 2 is a side sectional view of the reactant gas supply system for the reactor of FIG. 1.

The reactant source vapors are produced and mixed with a carrier gas outside of the reactor tube 12 in a gas supply system 54, as illustrated in FIG. 2. A carrier gas is provided from a supply 56. The carrier gas for the deposition of materials containing tellurium is preferably hydrogen. Hydrogen from the supply 56 is diffused through palladium in a carrier gas cleaner 58, to remove impurities that might otherwise later be unintentionally deposited upon the substrate 30. Portions of the carrier gas are passed through subsections of the gas supply system 54 to collect fractions of reactant source vapors for delivery to the reactor 10. In the embodiment illustrated in FIG. 2, a portion of the hydrogen carrier gas is bubbled through liquid dimethylcadmium in a bubbler 60 to incorporate a partial pressure of the dimethylcadmium reactant source vapor into that portion of the hydrogen stream. Another portion of the hydrogen carrier gas is passed over solid 2,5-dihydrotellurophene in a sublimber 62 to incorporate a fraction or partial pressure of 2,5-dihydrotellurophene reactant source vapor into that portion of the hydrogen stream. In a similar fashion, additional components can be added to the hydrogen gas stream in a supplementary source, schematically illustrated at reference numeral 64. The additional components could include, for example, a mercury-containing reactant source vapor or reactant source vapors for dopants to be included in the deposited film. The portions of the hydrogen carrier gas stream to which reactant source vapors have been added are then mixed with a diluent portion 66 of the hydrogen gas stream that adjusts the overall concentrations of the reactant source vapors to appropriate levels and dilutes the gas stream. The flows of the gases are determined and controlled by electronic mass flow controllers 68 that adjust and maintain precise gas flows during extended deposition procedures.

To provide for a deposition rate that is sufficient for economical operation of the CVD reactor 10, the respective reactant source from which each reactant source vapor is produced must have a sufficiently high vapor pressure that a high flow is introduced into the carrier gas. It has been determined that the vapor pressure of the reactive source of tellurium should be at least about 0.5 millimeters of mercury at an ambient temperature of about 22 C to obtain a useful growth rate of the film containing tellurium.

The obtaining of a sufficient flow rate of the reactant source vapor containing tellurium must be accompanied by a decomposition characteristic of the reactant vapor molecule wherein sufficient bonds of the molecule break to release elemental tellurium, below the selected deposition temperature, here about 200° C. to about 300° C., in a half life of less than about 1 second. That is, a high vapor pressure of a very stable gaseous species will not successfully deposit the desired film layers, since insufficient decomposition of the reactant vapor molecules will occur. Conversely, a low vapor pressure of a fully-dissociated gaseous molecule will produce film growth, but at unacceptably low growth rates. Unfortunately, the reactant source vapor pressure is usually found to be reduced for reactant source vapor species having low decomposition temperatures, and vice versa.

Several reactant source vapor species containing tellurium have been identified as having a sufficiently high vapor pressure and also a decomposition characteristic whereby essentially complete dissociation is achieved at temperatures below about 300° C. in a half life of less than about 1 second. The tellurophenes are a group of heterocyclic compounds having four carbon atoms and a tellurium atom bonded in a ring, with various numbers of hydrogen atoms bonded to the carbon atoms. (As used herein, the term "tellurophene" means all of the members of this heterocyclic family.) The basic member of the family, C4H4Te, has one hydrogen atom bonded to each of the four carbon atoms, and has a high vapor pressure in conjunction with a moderately high decomposition temperature. Its structure is:

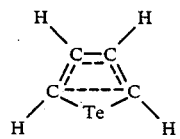

Tetrahydrotellurophene, C4H8Te, is fully saturated with two hydrogen atoms joined to each of the four carbon atoms:

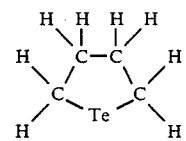

Tetrahydrotellurophene has a lower decomposition temperature than C4H4Te, but also a much lower vapor pressure.

2,5-dihydrotellurophene, C4H6Te, is a partially saturated molecule wherein two of the carbon atoms are joined by a double bond and each has one attached hydrogen atom, while two of the carbon atoms each have two attached by hydrogen atoms:

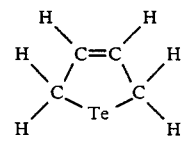

2,5-dihydrotellurophene is the presently preferred tellurophene for use as a reactant source vapor for chemical vapor deposition of tellurium, as its vapor pressure and decomposition temperature provide a good compromise between the extremes of the saturated and unsaturated molecules. The vapor pressure of 2,5-dihydrotellurophene is about 0.5 millimeters of mercury at ambient temperature, and it decomposes fully at temperatures below 250° C. with a half life of less than 1 second.

Methyltellurol (CH3TeH) also provides the desired high vapor pressure and decomposition temperature below 300° C. It is less preferred than the tellurophenes, because of its sensitivity to light and moisture. If these potential problems are avoided, methyltellurol becomes a highly desirable source of tellurium.

The reactant sources for the species to be codeposited with tellurium must also exhibit a sufficiently high vapor pressure, and the reactant source gases produced therefrom must have low complete decomposition temperatures. Dimethyl cadmium (CH3—Cd—CH3) meets this requirement as a source of cadmium. Dimethylmercury (CH3—Hg—CH3) and diethylmercury (C2H5—Hg—C2H5) are satisfactory sources for mercury. Diethylmercury, with weaker Hg—C bonding, has a lower decomposition temperature, but dimethylmercury has a high vapor pressure.

The use of these reactant source vapors in a CVD reactor, with the substrate maintained at a temperature of at least about 200° C., preferably about 200° C. to about 300° C., and most preferably about 250° C., results in deposition of a film of cadmium telluride on the substrate.

In the preferred approach, cadmium telluride epitaxial layers were grown on (001) CdTe single crystal substrates and (001) InSb single crystal substrates, at atmospheric pressure, in the reactor 10. The reactant sources were 2,5-dihydrotellurophene (obtained from American Cyanamid Co.) for tellurium and dimethylcadmium (obtained from Alfa Ventron) for cadmium.

Palladium-diffused hydrogen gas was used as the diluent as well as the carrier gas for both the 2,5 -dihydrotellurophene and the dimethylcadmium. The total flow through the reactor was about 2.9 standard liters per minute, with the relative flow rate of each of the two reactant source vapors adjusted to yield equal amounts of cadmium and tellurium in the film.

Cadmium telluride epitaxial films of about 2.54 centimeter diameter were grown on indium antimonide substrates at substrate temperatures range from about 250° C. to about 330° C., and on cadmium telluride substrates at substrate temperatures ranging from about 250° to about 285° C. In these temperature ranges, it was observed that the growth rate of the film was independent of temperature and light level, and varied linearly with the flow rate of the hydrogen gas through the tellurium source. Having a growth rate independent of temperature and ambient light is an important advantage, since variations in temperature and light intensity across the surface of a growing film do not then cause nonuniformities in the thickness of the film. It is difficult to maintain precise temperature control over large surface areas, and a growth rate that is independent of temperature significantly contributes to the ability to grow laterally large, uniform films Electrical conductivity, p-type carrier concentration and ambient temperature Hall mobility were measured on epitaxial layers grown on the cadmium telluride substrates by the van der Pauw technique using samples of 5 millimeter by 5 millimeter size with cloverleaf patters.

Sixteen runs were made to grow cadmium telluride films on cadmium telluride substrates. The gas flow parameters are stated in Table 1. The term "H$_2$ Flow/Cd" means the flow rate of hydrogen carrier gas through the dimethylcadmium source in standard cubic centimeters per minute (sccm). The Total H$_2$Flow is the sum of diluent hydrogen gas and the hydrogen gas carrying the reactant source vapor species.

TABLE 1

| Run | H$_2$ Flow/Cd (sccm) | H$_2$ Flow/Te (sccm) | Total H$_2$ Flow (sccm) |
|---|---|---|---|
| 1 | 87.5 | 500 | 2888 |
| 2 | 67.5 | 400 | 2998 |
| 3 | 70.0 | 400 | 3000 |
| 4 | 70.0 | 800 | 3040 |
| 5 | 60.0 | 800 | 3000 |
| 6 | 80.0 | 800 | 3000 |
| 7 | 80.0 | 800 | 3000 |
| 8 | 90.0 | 800 | 2900 |
| 9 | 70.0 | 800 | 2900 |
| 10 | 65.0 | 800 | 2895 |
| 11 | 75.0 | 800 | 2875 |
| 12 | 55.0 | 800 | 2905 |
| 13 | 60.0 | 800 | 2900 |
| 14 | 50.0 | 800 | 2900 |
| 15 | 60.0 | 800 | 2900 |
| 16 | 50.0 | 800 | 2900 |

The results of the 16 growth runs of cadmium telluride on cadmium telluride substrates are summarized in Table 2.

TABLE 2

| Run | Temp (C.) | Time (min) | Thickness (micron) | [Cd]:[Te] | Conduc (mhos) | Carrier Concen (cm$^{-3}$) | Hall mobility (300K) |
|---|---|---|---|---|---|---|---|
| 1 | 275 | 30 | 1.2 | 9 | 1.67 | $2 \times 10^{17}$ | 57 |
| 2 | 285 | 180 | 5.8 | 6 | * | * | * |
| 3 | 285 | 120 | 3.8 | 6 | 0.20 | $2 \times 10^{16}$ | 64 |
| 4 | 282 | 60 | 3.8 | 3 | 0.38 | $5 \times 10^{16}$ | 48 |
| 5 | 282 | 60 | 3.8 | 3 | 0.04 | $7 \times 10^{15}$ | 35 |
| 6 | 282 | 60 | 3.8 | 3 | 0.10 | $2 \times 10^{16}$ | 44 |
| 7 | 282 | 60 | 3.8 | 4 | 0.12 | $4 \times 10^{16}$ | 19 |
| 8 | 282 | 60 | 3.8 | 5 | 0.77 | $1 \times 10^{17}$ | 49 |
| 9 | 282 | 60 | 3.8 | 4 | 0.10 | $2 \times 10^{16}$ | 36 |
| 10 | 282 | 60 | 3.8 | 4 | 0.19 | $3 \times 10^{16}$ | 40 |
| 11 | 282 | 60 | 3.8 | 4 | 0.29 | $5 \times 10^{16}$ | 38 |
| 12 | 282 | 50 | 3.8 | 3 | 0.14 | $1 \times 10^{16}$ | 72 |
| 13 | 282 | 30 | 1.9 | 3 | 0.50 | $6 \times 10^{16}$ | 47 |
| 14 | 282 | 30 | 1.9 | 3 | 0.33 | $4 \times 10^{16}$ | 60 |
| 15 | 272 | 60 | 3.8 | 3 | 0.25 | $5 \times 10^{16}$ | 35 |
| 16 | 250 | 60 | 3.8 | 3 | 0.09 | $7 \times 10^{15}$ | 80 |

*-Not determined

Electron channeling contrast patterns were prepared for all of these materials, and these patterns verified that the epitaxial layers were single crystal and of the same (001) crystallographic orientation of the substrate.

Fifteen samples were prepared of cadmium telluride deposited upon a (001) indium antimonide substrate. The gas flow parameters during deposition are presented in Table 3.

TABLE 3

| Run | H$_2$ Flow/Cd (sccm) | H$_2$ Flow/Te (sccm) | H$_2$ Flow/Total (sccm) |
|---|---|---|---|
| 1 | 72.0 | 91 | 2963 |
| 2 | 91.0 | 900 | 2791 |
| 3 | 72.0 | 500 | 2872 |
| 4 | 87.5 | 500 | 2898 |
| 5 | 87.5 | 400 | 2898 |
| 6 | 36.5 | 400 | 2897 |
| 7 | 54.0 | 400 | 2894 |
| 8 | 58.5 | 400 | 2899 |
| 9 | 51.5 | 400 | 2892 |
| 10 | 12.5 | 100 | 2893 |
| 11 | 25.0 | 200 | 2895 |
| 12 | 50.0 | 400 | 2900 |
| 13 | 70.0 | 400 | 3000 |
| 14 | 75.0 | 400 | 2995 |
| 15 | 65.0 | 400 | 2995 |

The substrate temperature and growth results for the 15 samples of cadmium telluride grown on indium antimonide are reported in Table 4. The film thickness is an average value determined by preparing Auger electron spectroscopy profiles of progressively sputtered surfaces. By this technique, two different interfaces marking the depth of the deposited layer can be identified, one for tellurium/antimony and the other for cadmium- /indium. The average of the two measurements is reported in Table 4.

TABLE 4

| Run | Temp (C.) | Time (min) | Thickness (microns) | [II]:[VI] |
|---|---|---|---|---|
| 1 | 250 | 30 | 0.75 | 35.1 |
| 2 | 250 | 30 | 0.55 | 4.5 |
| 3 | 250 | 30 | 0.36 | 6.4 |
| 4 | 300 | 30 | 1.67 | 9.6 |
| 5 | 285 | 30 | 1.09 | 12.0 |
| 6 | 280 | 20 | 0.71 | 4.1 |
| 7 | 285 | 30 | 1.03 | 6.0 |
| 8 | 285 | 30 | 1.05 | 5.0 |
| 9 | 280 | 30 | 1.07 | 4.4 |
| 10 | 270 | 30 | 0.32 | 2.8 |
| 11 | 285 | 30 | 0.49 | 4.3 |
| 12 | 329 | 15 | 0.68 | 4.3 |
| 13 | 288 | 20 | 0.62 | 6.0 |
| 14 | 285 | 20 | 0.80 | 6.4 |
| 15 | 285 | 20 | 0.91 | 5.5 |

The uniformity of the cadmium telluride epitaxial layer on the indium antimonide was measured by secondary ion mass spectrometry (SIMS) to assess thickness uniformity for a sample chosen at random. This technique is accurate to within about 3 percent change for the thicknesses studied. There was no detectable thickness variation over an area of about 3 square centimeters on the surface of the sample, indicating that any thickness variation was less than 3 percent.

Figure 3:
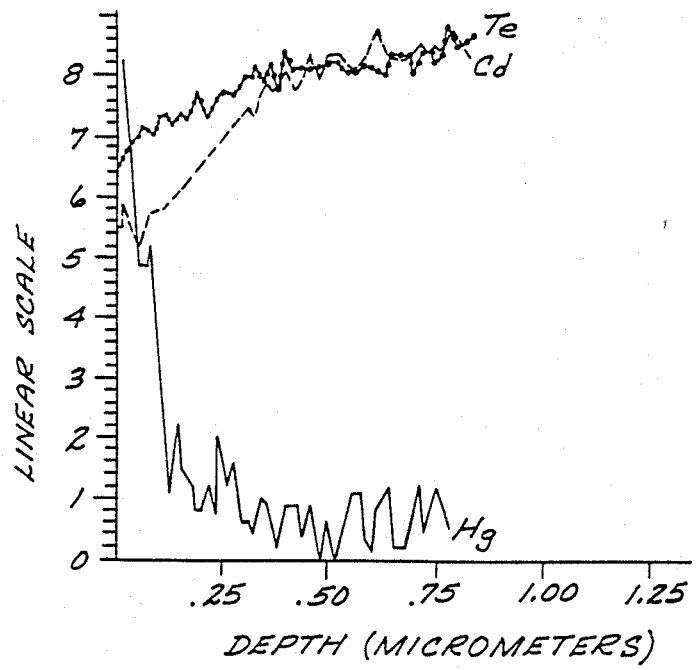
FIG. 3 is an Auger profile of mercurcy cadmium telluride thin film grown on a cadmium telluride substrate.

Mercury telluride was deposited on single crystal cadmium tellurice using an approach similar to that described above. Diethylmercury was placed in the bubbler 60 in place of dimethylcadmium. The hydrogen gas flow rate through the diethylmercury was about 900 sccm, the hydrogen gas flow rate through the 2,5-dihydrotellurophene was 800 sccm, and the total hydrogen gas flow rate was 2900 sccm. Deposition temperatures of 275° C. and 300° C. were used, with total deposition times of 30 to 60 minutes. Four growth runs were made. FIG. 3 is an Auger profile of mercury, cadmium and tellurium as a function of depth below the surface. The surface layer of about 0.2 micrometers is a mercury cadmium telluride solid solution alloy film due to diffusion of cadmium from the bulk of the substrate. FIG. 3 demonstrates that mercury, cadmium and tellurium are all present in the film, but the results are not calibrated with standards to determine the exact amounts of each element present.

As is now apparent, the method of the present invention permits the chemical vapor deposition of epitaxial thin films of (II, III, IV-tellurium) compounds at growth temperatures well below those previously possible. New reactive sources of tellurium have been identified, which meet the criteria defined herein for successful CVD at temperatures below 300° C. of materials containing tellurium. Although particular embodiments of the invention dealing with the deposition of cadmium telluride, mercury telluride, and mercury cadmium telluride have been described in detail for purposes of illustration, various modifications may be made without departing from the spirit and scope of the invention. Accordingly, the invention is not to be limited except as by the appended claims.

What is claimed is:

1. A method of depositing on a substrate a thin film of a material containing tellurium, comprising the steps of:
   providing a first reactant source vapor having therein molecules containing tellurium selected from the group consisting of a tellurophene and methyltellurol;
   mixing the first reactant source vapor with a second reactant source vapor having therein molecules containing another substance to be codeposited with the tellurium; and
   contacting the mixture to a substrate maintained at a temperature of from about 200° C. to about 300° C.

2. The method of claim 1, wherein one substance codeposited with tellurium is cadmium.

3. The method of claim 2, wherein the source of the cadmium is dimethylcadmium.

4. The method of claim 1, wherein the substance codeposited with tellurium is selected from the group consisting of cadmium, mercury, and combinations of cadmium and mercury.

5. The method of claim 4, wherein the substance codeposited includes mercury, and the source of the mercury is selected from the group consisting of dimethylmercury and diethylmercury.

6. The method of claim 1, wherein the substrate is selected from the group consisting of cadmium telluride and indium antimonide.

7. The method of claim 1, wherein the reactant source vapor is methyltellurol.

8. The method of claim 1, wherein the temperature of the substrate is maintained at about 250° C.

9. The method of claim 1, wherein said step of contacting is conducted in an inverted vertical chemical vapor deposition reactor.

10. A combination of a thin film and a substrate prepared by the method of claim 1.

11. A method of depositing on a substrate a thin film of a material containing tellurium comprising the steps of:
   providing a reactant source vapor containing tellurium selected from the group consisting of a tellurophene and methyltellurol;
   mixing the reactant source vapor containing tellurium with a reactant source vapor containing another substance to be codeposited with the tellurium, the other substance being selected from the gorup consisting of cadmium, mercury, and combinations of cadmium and mercury; and
   introducing the mixture into an inverted vertical chemical vapor deposition reactor, wherein a substrate is maintained at a temperature of from about 200° C. to about 300° C.

12. The method of claim 11, wherein the face of the substrate upon which deposition occurs has a surface area of greater than about 1 square centimeter.

13. The method of claim 11, wherein the reactant source vapor is methyltellurol.

14. A combination of a thin film and a substrate prepared by the method of claim 11.

15. A method for depositing on a substrate a thin film of a material containing tellurium, comprising the steps of:
   providing an organometallic reactant source of tellurium, the source being a substance that produces a molecular reactant source vapor containing tellurium and has a vapor pressure of at least 0.5 millimeters of mercury at ambient temperature, the reactant source vapor having a decomposition temperature, whereat elemental tellurium is released, at less than about 300° C. and having a molecular half life of less than about 1 second at a temperature of from about 200° C. to about 300° C.;

mixing the reactant source vapor containing tellurium with a reactant source vapor containing another substance to be codeposited with the tellurium, the other substance being selected from the group consisting of elements from group II, group III, and group IV of the periodic table, and mixtures thereof; and contacting the mixture to a substrate maintained at a temperature of less than about 300° C., whereupon the reactant source vapors in the mixture react to codeposit a material containing tellurium upon the substrate.

16. The method of claim 15, wherein the substance to be codeposited with tellurium is selected from the group consisting of cadmium, mercury, and combinations thereof.

17. The method of claim 15, wherein the source of tellurium is selected from the group consisting of a tellurophene and methyltellurol.

18. The method of claim 15, wherein said step of contacting is accomplished in an inverted vertical chemical vapor deposition reactor having a substrate facing downwardly.

19. The method of claim 15, wherein the substrate is selected from the group consisting of cadmium telluride and indium antimonide.

20. A combination of a thin film and a substrate prepared by the method of claim 15.

* * * * *